United States Patent
Ayotte et al.

(10) Patent No.: US 8,619,824 B2
(45) Date of Patent: Dec. 31, 2013

(54) LOW WHITE FREQUENCY NOISE TUNABLE SEMICONDUCTOR LASER SOURCE

(75) Inventors: Simon Ayotte, Saint-Augustin-de-Desmaures (CA); Michel Morin, Quebec (CA); Michel Poulin, Quebec (CA); Christine Latrasse, Quebec (CA); Yves Painchaud, Quebec (CA)

(73) Assignee: Teraxion Inc., Québec (CA)

(*) Notice: Subject to any disclaimer, the term of this patent is extended or adjusted under 35 U.S.C. 154(b) by 137 days.

(21) Appl. No.: 13/225,155

(22) Filed: Sep. 2, 2011

(65) Prior Publication Data

US 2012/0063474 A1 Mar. 15, 2012

Related U.S. Application Data

(60) Provisional application No. 61/379,895, filed on Sep. 3, 2010.

(51) Int. Cl.
*H01S 3/10* (2006.01)

(52) U.S. Cl.
USPC ............. 372/20; 372/25; 372/28; 372/32

(58) Field of Classification Search
USPC ................................. 372/20, 25, 28
See application file for complete search history.

(56) References Cited

U.S. PATENT DOCUMENTS

| | | | |
|---|---|---|---|
| 6,707,967 | B2 | 3/2004 | Rothenberg |
| 7,474,411 | B2 | 1/2009 | Du Bois et al. |
| 2006/0216031 | A1* | 9/2006 | Suh et al. ............... 398/85 |
| 2009/0059209 | A1* | 3/2009 | Nguyen et al. .......... 356/73.1 |

OTHER PUBLICATIONS

A. E. Siegman, Lasers, 1986, University Science Books.

H. M. Wiseman, Light amplification without stimulated emission: Beyond the standard quantum limit to the laser linewidth, Phys. Rev. A, 1999, 4083, 60(5).

R. E. Bartolo, A. Tveten and C. K. Kirkendall, The quest for inexpensive, compact, low phase noise laser sources for fiber optic sensing applications, Proc. SPIE, 2009, 7503-70.

S. Haykin, Communication systems, 1978, Chapter 2, John Wiley & Sons.

M. Okai, Narrow-Linewidth and Tunable Semiconductor Laser Devices, Frequency Control of Semiconductor Lasers, 1996, John Wiley & Sons.

C. K. Kirkendall and A. Dandridge, Overview of high-performance fibre-optic sensing, J. Phys. D: Appl. Phys. 2004, 37, R197.

G. J. McDonald, D. A. Orchard, and A. C. Lewin, A novel, rugged and robust longitudinal range finding method for formation flying missions, European Space Agency Special Publication No. 654, 2008, Missions and Technologies.

(Continued)

*Primary Examiner* — Dung Nguyen

(74) *Attorney, Agent, or Firm* — Thomas|Horstemeyer, LLP.

(57) ABSTRACT

A low white frequency noise tunable semiconductor laser source is presented. The laser source includes a single-mode semiconductor laser assembly which generates a laser beam having a tunable frequency over a spectral range of interest. An optical filter is provided in the path of the laser beam. The optical filter has multiple spectral features distributed over the entire spectral range of interest. Each spectral feature has a narrow spectral range. A locking mechanism is further provided and is controllable for locking a spectral alignment between the frequency of the laser beam and any selected one of the spectral features of the optical filter.

35 Claims, 13 Drawing Sheets

(56) References Cited

OTHER PUBLICATIONS

C. Middleton and R. Desalvo, Balanced coherent heterodyne detection with double sideband suppressed carrier modulation for high performance microwave photonic links, IEEE Avionics, Fiber-Optics and Photonics Technology Conference, 2009, p. 15-16, AVFOP.

T. Pfau, S. Hoffman, and R. Noe, Hardware-efficient coherent digital receiver concept with feedforward carrier recovery for M-QAM constellations, J. Lightwave Technol., 2009, 989, 27(8).

M. Okai, M. Suzuki, T. Taniwatari, Strained multiquantum-well corrugation-pitch-modulated distributed feedback laser with ultranarrow (3.6 kHz) spectral linewidth. Electron. Lett., 1993, 1696, 29(19).

R. E. Bartolo, A. B. Tveten, C. K. Kirkendall, et al. Characterization of a low-phase-noise, high-power (370 mW), external-cavity semiconductor laser, Naval Research Laboratory, 2010, 9272, NRL/MR/5670-10.

M. Ohtsu and S. Kotajima, Linewidth reduction of a semiconductor laser by electrical feedback, IEEE J. Quantum Electron, 1985, 1905 QE-21(12).

M. Poulin, Y. Painchaud, M. Aub., et al. Ultra-narrowband fiber Bragg gratings for laser linewidth reduction and RF filtering, Proc. SPIE, 2010, 7579, paper 75791C.

J. Hald and V. Ruseva, Efficient suppresion of diode-laser phase noise by optical filtering. J. Opt. Soc. Am. B., 2005, 2338, 22(11).

T. Nazaova, C. Lisday, F. Riehle, and U. Sterr, Low-frequency-noise diode laser for atom interferometry, J. Opt. Soc. Am. B., 2008, 1632, 25(10).

R. W. P. Drever, J. L. Hall, F. V. Kowalski, et al., Laser phase frequency stabilization using an optical resonator, Appl. Phys. B, 1983, 97, 31(2).

A. J. Ward, D. J. Robbins, G. Busico, et al., Widely tunable DS-DBR laser with monotically integrated SOA: design and performance, IEEE J. Select. Topics Quantum Electron, 2005, 149, 11(1).

B. Pozeshkli, E. Vail, J. Kubicky et al., 20-mW widely tunable laser module using DFB array and MEMS selection, IEEE Photon. Technol. Lett., 2002, 1457, 14(10).

R. Slavik, S. Doucet, and S. Larochelle, High-performance all-fiber Fabry-Perot filters with superimposed chirped Bragg gratings, J. Lightwave Technol., 2003, 1059, 21(4).

A. Othonos and K. Falli, Fiber Bragg Gratings: Fundamentals and Applications in Telecommunications and Sensing, Artech House, 1999, Section 3.3.

\* cited by examiner

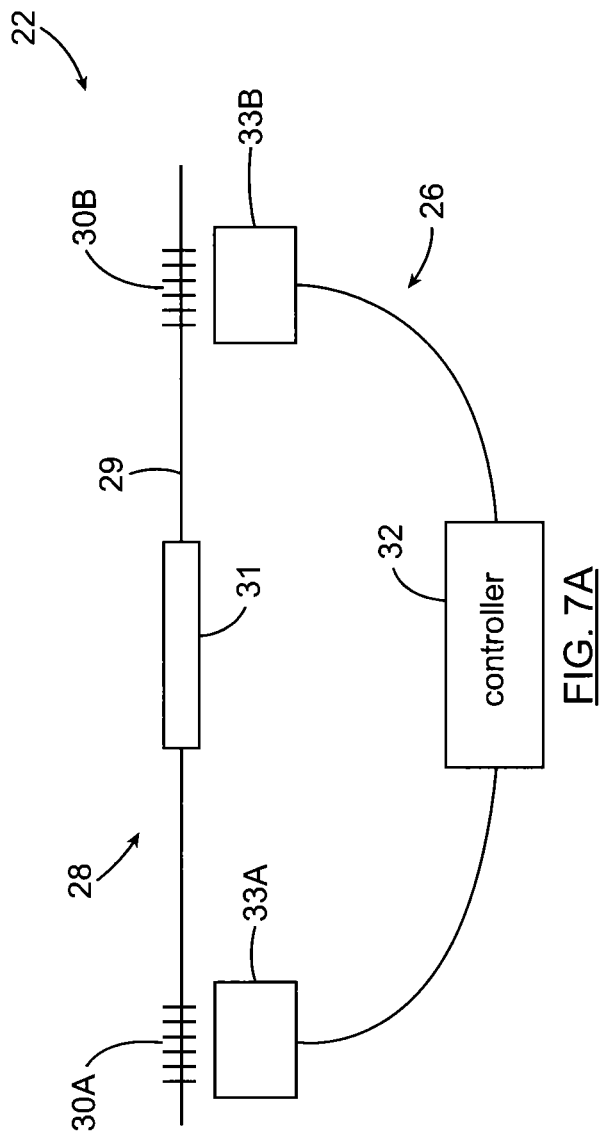
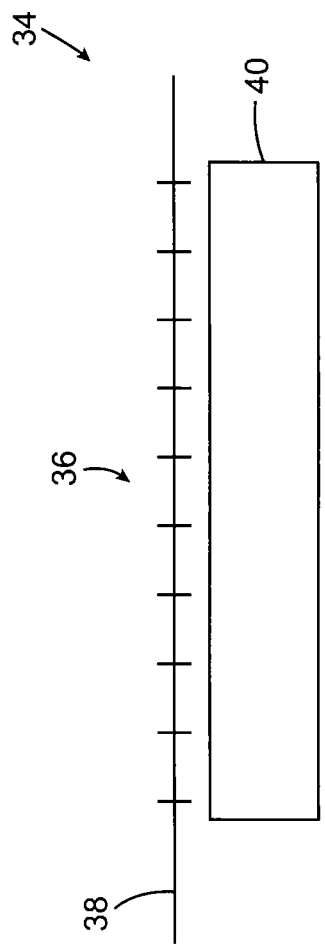

LOW WHITE FREQUENCY NOISE TUNABLE SEMICONDUCTOR LASER SOURCE

CROSS-REFERENCE TO RELATED APPLICATION

The present application claims priority from U.S. provisional application No. 61/379,985, the contents of which are incorporated herein by reference.

FIELD OF THE INVENTION

The present invention relates to the field of single mode, low noise lasers. More particularly, the invention describes the use of multi-channel narrowband optical filters to suppress the white frequency noise intrinsic to semiconductor lasers.

BACKGROUND

In comparison to other light sources, lasers can produce highly coherent optical is waves with a well defined and stable optical frequency. An ideal single mode laser would produce a perfectly monochromatic optical field with amplitude and frequency that are constant in time. In practice, the amplitude and frequency of an optical wave produced by even the best single mode lasers display small fluctuations in their amplitude and frequency, known as amplitude noise (or intensity noise) and frequency noise (or phase noise). Frequency and phase noises are related inasmuch as frequency is the time derivative of phase.

Optical field fluctuations result partly from variations in the laser structure and excitation. For example, variations in the power provided to the gain medium to excite atoms or molecules to a higher energy level can translate into amplitude and phase noise in the optical field produced by the laser. Amplification dynamics can exacerbate these fluctuations at some frequencies. For example, Er-doped fiber lasers (EDFL) typically present a resonance peak in intensity noise at frequencies of a few hundreds of kilohertz. Likewise, thermal fluctuations and vibrations can alter the geometry and the optical path length of an optical resonator, thus modifying the resonance conditions and adding frequency noise to the optical field. Such fluctuations resulting from variations in laser structure and excitation are sometimes referred to as technical noise.

Fundamental quantum noise also affects the laser field. Albeit much weaker than stimulated emission, spontaneous emission still contributes a random component to the laser field that translates into intensity and phase noise. Optical losses, either through absorption, scattering or coupling, also add a random component to the to optical field. From a quantum point of view, an optical loss represents an average probability of a photon being lost, random fluctuations around this average value being allowed.

Measures can be taken to stabilize the laser structure and reduce the associated technical noise. However, quantum noise cannot be reduced below a fundamental limit, which determines the narrowest linewidth achievable with a given laser known as the Schawlow-Townes limit. This limit is found to scale as the inverse of the total optical power produced by the laser, including power lost by absorption and scattering, and as the square of the cold cavity linewidth, i.e. the linewidth determined by the cavity length and round trip loss without gain. It is usually the case that technical noise dominates quantum noise and leads to a laser linewidth sizably larger than the Schawlow-Townes limit.

Intensity and phase noise affecting an optical field are usually treated as stationary random variables with statistical properties that do not vary in time. Such variable is characterized in the frequency domain by a power spectral density (PSD), taken as the Fourier transform of its autocorrelation function. FIG. 1 (PRIOR ART) presents frequency noise PSDs measured on an EDFL and a distributed feedback (DFB) semiconductor laser. The frequency noise PSD is expressed in Hz²/Hz. The statistical variance of the laser frequency can be calculated from the PSD according to $$\sigma_{freq}^2 = \int_0^\infty S_{freq}(f) df, \qquad (1)$$

where $S_{freq}$ is the frequency noise PSD and f is the frequency. As seen in FIG. 1, both lasers display a frequency noise PSD with a 1/f variation at low frequencies, which results from technical noise. A floor of white frequency noise at high frequencies that results from quantum noise is clearly visible in the case of the DFB semiconductor laser. This strong white noise component can be explained by a number of factors. The resonator of a semiconductor laser is typically very short and optical loss by absorption and scattering found therein are sizable, two conditions that exacerbate quantum noise. Moreover, gain fluctuations resulting from spontaneous emission are accompanied by fluctuations in the index of refraction of the semiconductor material. Not only does spontaneous emission add a random component to the optical field, it also affects the phase of the coherent component of the optical field via a random perturbation of the optical path within the laser resonator.

Semiconductor lasers present many advantages over other lasers. They are the most efficient, giving more watts of optical output power per watt of electrical power. They are small, lightweight, rugged and insensitive to vibrations by virtue of their monolithic construction. In comparison to other solid-state lasers, single-mode semiconductor lasers display a relatively small intensity noise, with a resonance peak occurring typically at a few GHz. They are cheap and available at many wavelengths, including at 1.5 micron for optical fiber telecommunications and sensing. So-called Integrated Tunable Laser Assemblies (ITLA), based on semiconductor lasers, are commercially available that can provide single-mode laser light over the whole C-band of telecommunications. However, the high level of white frequency noise in semiconductor lasers disqualifies them for some high-end applications, such as high-sensitivity optical fiber sensing, high-resolution range finding, RF photonics, next generation optical telecommunications networks and the like.

Various means have been considered to improve the frequency noise of semiconductor lasers. As aforementioned, the quantum-noise limited linewidth scales inversely to the total optical power. A reduction in white frequency noise is thus expected by running a laser at a higher output power. Likewise, the quantum-noise limited linewidth scales as the square of the cold cavity linewidth. Since the cold cavity linewidth scales inversely to the cavity length, a reduction in white frequency noise is also expected when increasing the cavity length. An increase in cavity length is usually achieved by using an external cavity with one or more reflectors separate from the semiconductor gain medium. Referring to Bartolo et al. ["Characterization of a low-phase-noise, high-power (370 mW), external-cavity semiconductor laser", Naval Research Laboratory, NRUMR/5670-10-9272, 2010], an external cavity semiconductor laser producing a low white frequency noise was demonstrated. Bartolo et al used a special semiconductor high-power amplifier, which allowed the laser to produce a single-mode output power of up to 370 mW. The external cavity used as reflector a fiber Bragg grating (FBG), which was coupled to the semiconductor amplifier by a lensed fiber. The combined length of the gain medium and the FBG reflector reached nearly 8 inches. The measured frequency noise was within a factor of two from that of a fiber laser, with no apparent white noise floor at frequencies up to 10 MHz. Such a system is fairly complex and presents many disadvantages. The monolithic nature of the semiconductor laser is lost and an increased sensitivity to vibrations ensues. Antireflection coatings are required on the end faces of the semiconductor gain medium to impede laser oscillation in the absence of the external cavity mirrors. Otherwise, coupled cavities are created and the spectral behavior of the laser becomes highly sensitive to the optical phase of the feedback provided by external mirrors. Moreover, cavity lengthening reduces the frequency spacing between longitudinal modes so that narrow band filtering becomes necessary to maintain the single-mode oscillation of the laser. When tuned in frequency, such a laser is prone to mode-hopping, i.e. sudden jumps between neighboring modes of oscillation.

The frequency of emission of a semiconductor laser is known to depend on the injection current. The frequency noise of such a laser can thus be reduced by an appropriate feedback signal to the injection current driving it. Reference can for example be made to M. Ohtsu and S. Kotajima, "Linewidth reduction of a semiconductor laser by electrical feedback", IEEE J. Quantum Electron. QE-21(12), 1905 (1985), for an explanation of this approach. To determine the feedback signal, a frequency discriminator, i.e. an optical filter with a steep spectral transition is used to translate frequency fluctuations of incoming light into intensity fluctuations. The intensity fluctuations are detected to provide an electrical signal mirroring the frequency fluctuations. A feedback signal deduced from this electrical signal is then is applied to compensate for these fluctuations. An example of such system is illustrated in FIG. 2 (PRIOR ART). In this example, a Fabry-Perot interferometer constituted of two highly reflective fiber Bragg gratings that are π-shifted with regards to one another was used as a discriminator. FIG. 3 shows the apodisation profile of the discriminator. As known in the art, such a device can be designed to reflect light over a spectral range of tens of GHz, except for a narrow band transmission peak in the middle of this spectral range. The spectral response of the interferometer is illustrated in FIGS. 4A and 4B, showing the narrow transmission peak (tens of MHz) surrounded by a wide reflection range. Frequency discrimination is achieved when the laser emission is locked spectrally to the side of the transmission peak. A limiting form of this all-fiber interferometer is a FBG with a π-phase shift in the middle FIG. 5 (PRIOR ART) compares the PSD of the frequency noise of a DFB semiconductor laser used in a system such as shown in FIG. 2, both with and without activating the feedback loop. As shown, the feedback loop approach allows a sizable frequency noise reduction up to a frequency of about 1 MHz. However, this approach does not reduce frequency noise at higher frequencies.

The above methods rely on modifying the behavior of a semiconductor laser, either by changing its structure or its excitation. Another approach consists in acting on the laser output instead, through optical filtering. A noisy laser has a wider linewidth of emission than a quiet laser. It is thus expected that narrowing down the spectrum of a laser output by optical filtering reduces the noise affecting this laser output. The following expression represents an optical field with an optical carrier frequency $f_c$, which is affected by a single frequency phase noise component of frequency $f_n$, i.e.

$$E_{optical}(f) = e^{j(2\pi f_c t + \Delta\phi \sin(2\pi f_n t))}. \quad (2)$$

This expression can be approximated as $$E_{optical}(f) \approx e^{j2\pi f_c t} + \frac{\Delta\phi}{2} e^{j2\pi(f_c+f_n)t} - \frac{\Delta\phi}{2} e^{j2\pi(f_c+f_n)t}. \quad (3)$$

where noise amplitude $\Delta\phi$ is small. The phase noise thus generates a sideband on each side of said optical carrier frequency, these sidebands being separated from the carrier frequency by frequency $f_n$, the amplitude of said sidebands being directly determined by the amplitude of the phase noise. As known in the art, under these conditions, attenuating the optical spectrum at frequencies $f_c \pm f_n$ with a pass band optical filter produces the same attenuation of phase noise (and frequency noise) at frequency $f_n$.

A few experimental demonstrations of semiconductor laser frequency noise reduction by optical filtering have been published by HALD et al. ["Efficient suppression of diode-laser phase noise by optical filtering", J. Opt. Soc. Am. B 22(11), 2338 (2005)] and NAZAROVA et al. ["Low-frequency-noise diode laser for atom interferometry", J. Opt. Soc. Am. B 25(10), 1632 (2008)]. Bulk Fabry-Perot interferometers with linewidth close to 9 kHz were used as the optical filter. The well known Pound-Drever-Hall technique [R. W. P. Dreyer, J. L. Hall, F. V. Kowalski, et al., "Laser phase and frequency stabilization using an optical resonator", Appl. Phys. B 31(2), 97 (1983)] was used to lock laser emission to one transmission peak of the interferometer. To this end, the laser output was phase modulated and the intensity reflected by the interferometer was detected to generate a feedback signal to the semiconductor laser. Optical filtering occurred by transmission of the laser light through the interferometer. By implementing a double passage through the interferometer to enhance filtering, HALD et al obtained a noise reduction of −85 dB at 1 MHz. However, the experimental set-ups used were complex and bulky, not readily applicable to commercial applications.

There is thus a need for practical means and methods to reduce the white frequency noise of semiconductor lasers that preserve as much as possible their inherent is advantages while making them suitable for aforementioned high-end applications.

SUMMARY OF THE INVENTION

In accordance with one aspect of the present invention, there is provided a low white frequency noise tunable semiconductor laser source. The laser source includes a single-mode semiconductor laser assembly generating a laser beam having a frequency. A laser tuning mechanism is coupled to the semiconductor laser assembly for tuning the frequency of the laser beam generated thereby over a spectral range of interest. The laser source further includes an optical filter in the path of the laser beam. The optical filter has multiple spectral features distributed over the entire spectral range of interest, each spectral feature having a narrow spectral range. Finally, the laser source includes a locking mechanism controllable for locking a spectral alignment between the frequency of the laser beam and any selected one of the spectral features of the optical filter.

In one embodiment, the spectral alignment between the laser beam and the selected spectral features is provided and maintained by controlling the laser tuning mechanism in view of a feedback signal provided by the locking mechanism. In another embodiment, the optical filter is also tunable, and can be used to maintain the spectral alignment.

Advantageously, laser sources according to embodiments of the invention can be tuned to various frequencies within the spectral range of interest while producing a beam having low noise characteristics, since the optical filter ensures good transmission or reflection of the laser beam frequency while filtering out optical power at other frequencies stemming from frequency noise. Embodiments using a tunable optical filter offer even more versatility since a judicious use of the tuning capacity of both the laser assembly and the optical filter allows the generation of a beam at any frequency within the spectral range of interest.

In accordance with another aspect of the invention, there is provided a method for providing a low white frequency noise laser beam at a tunable frequency, including the following steps:

generating the laser beam with a single-mode semiconductor laser at the desired frequency. The frequency is tunable over a spectral range of interest;

filtering the laser beam with an optical filter having multiple spectral features distributed over the entire spectral range of interest, each spectral feature having a narrow spectral range; and locking a spectral alignment between the frequency of the laser beam and a selected one of the spectral features of the optical filter.

Other features and advantages of the present invention will be better understood upon a reading of preferred embodiments thereof with reference to the appended drawings.

BRIEF DESCRIPTION OF THE DRAWINGS

FIG. 7A to 7C are schematic representations of various embodiments of semiconductor laser assembly and associated tuning mechanism.

DESCRIPTION OF EMBODIMENTS OF THE INVENTION

In accordance with one aspect of the invention, there is proposed a semiconductor laser source which is tunable in frequency and has a reduced white frequency noise with respect to known semiconductor laser sources.

Laser sources according to embodiments of the invention can be suitable for a variety of commercial applications. For example, applications such as high-sensitivity optical fiber sensing, high-resolution range finding, RF photonics, next generation optical telecommunications networks and the like can all benefit from the low noise and tunable qualities of such devices. Of course, one skilled in the art will readily understand that laser sources according to embodiments of the invention can be used in other contexts without departing from the scope of the present invention.

The expression "low white frequency noise" is understood to refer to the ability of the laser source to generate a light beam having a noise level sufficiently low to be used in applications such as those mentioned above, over the entire spectral range of interest. As mentioned above, it is known to compensate for the noise seen at lower frequencies of the spectral range of interest using various techniques, but one advantage of the present invention is that it provides a reduction in the higher frequency noise as well.

Figure 6:
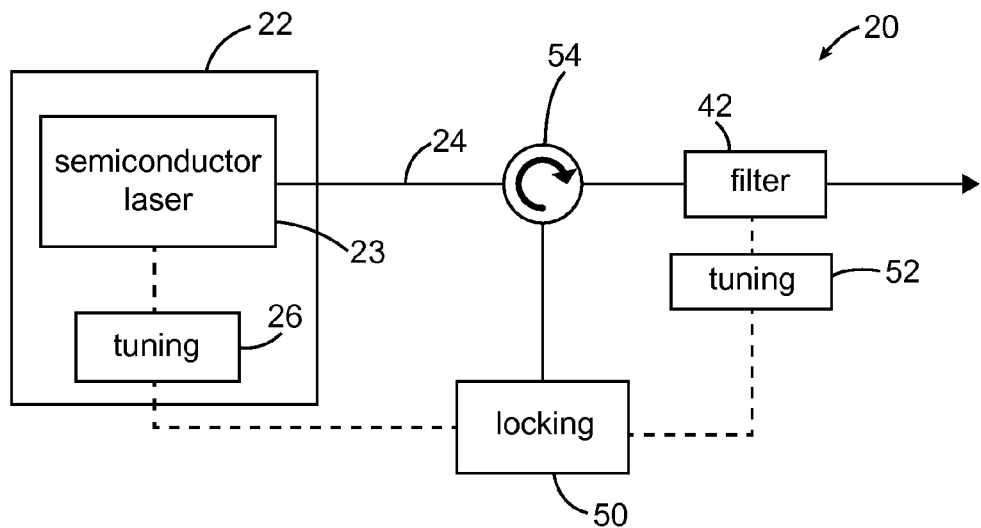
FIG. 6 is a schematic representation of a semiconductor laser source according to an embodiment of the invention.

Referring to FIG. 6, there is schematically illustrated a low white frequency noise tunable laser source 20 according to one embodiment of the invention.

The laser source 20 first includes a tunable semiconductor laser assembly 22 which generates a laser beam 24 having a frequency. The laser assembly 22 includes a single-mode semiconductor laser 23 and a laser tuning mechanism 26 coupled to the semiconductor laser 23 for tuning the frequency of the laser beam 24 over a spectral range of interest. In some cases, the laser assembly can comprise multiple semiconductor lasers 23.

One skilled in the art will readily understand that the expression "frequency" is meant to refer to the optical frequency of the laser beam as determined by the physics of the laser cavity. The expressions "wavelength" and "spectral" also relate to the same concept. The spectral range of interest is generally understood to refer to a broad range of possible values for the frequency of the laser beam, as determined from the application to which the laser source is destined. For example, for telecommunication applications, the spectral range of interest may be the entire C-band of optical telecommunications, generally considered to extend from 1530 to 1565 nm, or portions thereof. The C-band is also of interest for optical fiber sensing applications, in order to take advantage of the low loss of optical fiber at these wavelengths. A multiplicity of sensors responding at different wavelengths distributed over the C-band can be multiplexed to achieve sensing at multiple locations along the optical fiber. Alternatively, the spectral range of interest may be embodied by other telecommunication bands such as the L-band (1565 nm to 1625 nm) or the S-band (1460 nm to 1530 nm) or portions or combinations of all three bands. In other embodiments, the spectral range of interest may be a different range dictated by the needs of the target application.

The semiconductor laser assembly 22 may be embodied by a variety of devices or combination of devices based on semiconductor laser technology and providing an output of a tunable frequency, that is, the frequency of the generated laser beam can be changed over a broad range according to user specifications. The tuning of the semiconductor laser assembly may be provided between various discrete frequency values distributed regularly or not over the spectral range of interest, or continuously over this range. The laser tuning mechanism 26 can accordingly be embodied by any means suitable to control the frequency of the generated laser beam 24.

A variety of lasers suitable for use as the semiconductor laser assembly 22 are available commercially. In some embodiments, the semiconductor laser assembly 22 may be embodied by an Integrated Tunable Laser Assembly (ITLA). ITLAs have been developed and commercialized for telecommunications purposes. ITLAs are generally cheap, small and efficient and can provide single mode power over the whole C-band of optical telecommunications. An ITLA is typically based on a Distributed Bragg Reflector (DBR) or a Distributed FeedBack (DFB) semiconductor laser structure.

Referring to FIG. 7A, in one embodiment of the invention, the semiconductor laser assembly includes a Distributed Bragg Reflector (DBR) laser structure 28. In a DBR structure, the laser cavity is defined along a waveguide 29 in which is provided a gain medium 31 on either sides of which are provided a pair of integrated Bragg reflectors 30A and 30B. A first one 30A of the Bragg reflectors has a controllable coarse reflectivity profile and the second one 30B shows tunable multiple reflectivity peaks. The optical frequency of emission of the laser is determined by the overlap between the coarse reflectivity profile on one side of the cavity and one of the reflectivity peaks on the other. In this embodiment, the laser tuning mechanism 26 may include a controller 32 for controlling these Bragg reflectors 30A, 30B through appropriate grating controlling means 33A, 33B. An example of such a laser can for example be found in J. Ward, D. J. Robbins, G. Busico, et al., "Widely tunable DS-DBR laser with monolithically integrated SOA: design and performance", IEEE J. Select. Topics Quantum Electron. 11(1) 149 (2005). In this example, the grating controlling means 33A includes a series of short contacts distributed along the grating 30A having the coarse reflectivity profile, and an injection current can be selectively provided to these contacts, controlling different parts of the grating 30A as may be desired. In this manner, the reflectivity profile can be tuned to a given frequency by injecting current in the appropriate contact. The position of the reflectivity peaks of the other grating 30B can also be controlled by providing an injection current in short contacts therealong as grating controlling means 33B. Of course, other grating tuning approaches such as means for stretching the Bragg reflectors or other temperature-changing means can also be considered.

Referring to FIG. 7B, in another embodiment, the semiconductor laser assembly 22 includes a distributed feedback (DFB) semiconductor laser structure 34. A DFB laser has a cavity structure defined by a diffraction grating 36 along an active waveguide 38. In this embodiment, the laser tuning mechanism may include a temperature-changing assembly 40 for imposing a temperature change on the diffraction grating 36 or a portion thereof, therefore changing its reflectivity profile and the frequency of the generated laser beam. Standard DFB semiconductor laser are typically tunable over a few nanometers by thermal tuning. Alternatively, other means of tuning the laser frequency such as stretching the device can be contemplated.

Figure 7C:
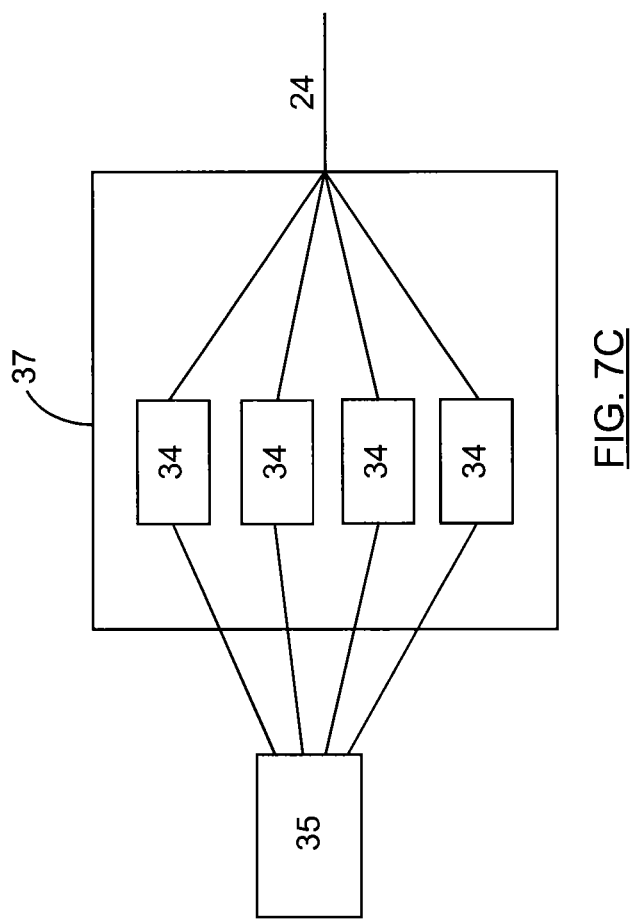

Referring to FIG. 7C, in another example, the semiconductor laser assembly 22 can be based on an array 37 of DFB semiconductor lasers units 34, each semiconductor laser unit 34 having an output frequency within a corresponding limited spectral range such that the limited spectral range of all of these units collectively cover the spectral range of interest. Tunability over a larger range is achieved by switching from one laser unit 34 to another. In such embodiments, the laser tuning mechanism 26 includes a selector 35 for selecting an output of one of the units of the array as the laser beam 24. In the illustrated example, the selector 35 is used to electrically activate only the laser unit 34 having the desired frequency. In another example, shown in B. Pezeshki, E. Vail, J. Kubicky et al., "20-mW widely tunable laser module using DFB array and MEMS selection", IEEE Photon. Technol. Lett. 14(10), 1457 (2002), all lasers are operated together and a MEMS tilt mirror selects the desired output. Other variants can also be imagined by one skilled in the art. Additionally, in some embodiments the frequency of the selected laser unit can itself be fine-tuned over the limited spectral range of this particular unit though known means, as explained above with respect to the tuning of DFB lasers. Such embodiments allow for the frequency of the generated laser beam to be set to any desired precise value.

In yet another embodiment, the semiconductor laser assembly could be an external cavity laser, such as for example the model TTX1994 Full Band Integratable Tunable Laser Assembly from the company EMCORE.

Referring back to FIG. 6, the laser source 20 further includes an optical filter 42 positioned in the path of the laser beam 24. The filter 42 has multiple spectral features distributed over the entire spectral range of interest, each spectral feature having a narrow spectral range.

The expression "spectral feature" is understood to refer to a peak in the spectral profile of the filter, either in transmission or in reflection. As one skilled in the art will readily understand, using a narrow spectral feature ensures that the frequency noise at frequencies outside of its range will be filtered out of the useful signal, both at lower and higher frequencies. By "narrow" it is understood that the reflection or transmission peaks have a spectral linewidth sufficiently small so that a suitable filtering of the frequency noise is achieved. Preferably, the spectral features should have a linewidth between a MHz and tens of MHz. In the embodiment illustrated in FIG. 6, filtered light is transmitted by optical filter 42, whereas light reflected by filter 42 is redirected by optical circulator 54 and detected to control the frequency of laser beam 24, as explained further below.

In one embodiment, the spectral features are distributed periodically along the spectral range of interest. In other embodiments this distribution may be non-uniform, as long at the number of spectral features and their separation are appropriate to provide an alignment between the frequency of the laser beam and one of the spectral features at desired positions along the spectral range of interest, as will also be described further below.

The optical filter can be a bulk Fabry-Perot interferometer. Given the much larger linewidth required than those used in prior art setups of HALD et al. and NAZAROVA et al mentioned above, shorter interferometers can be used. Alternatively, the optical filter can be embodied by an all-fiber Fabry-Perot interferometer.

Figure 1:
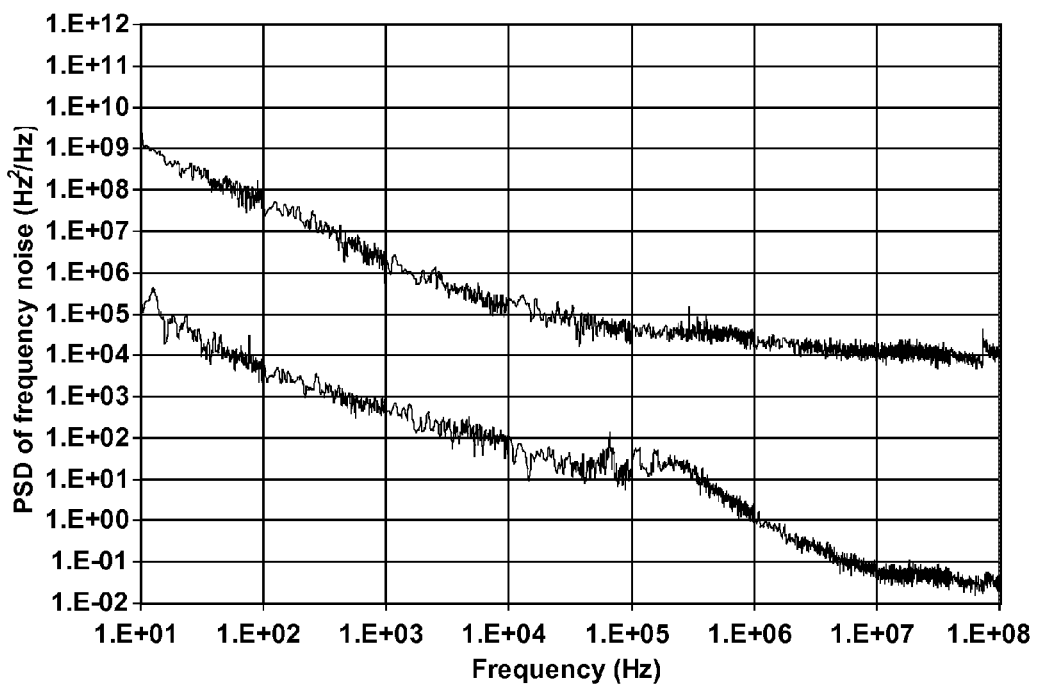
FIG. 1 (PRIOR ART) is a graph showing the power spectral density of the frequency noise of two commercial lasers.
Figure 2:
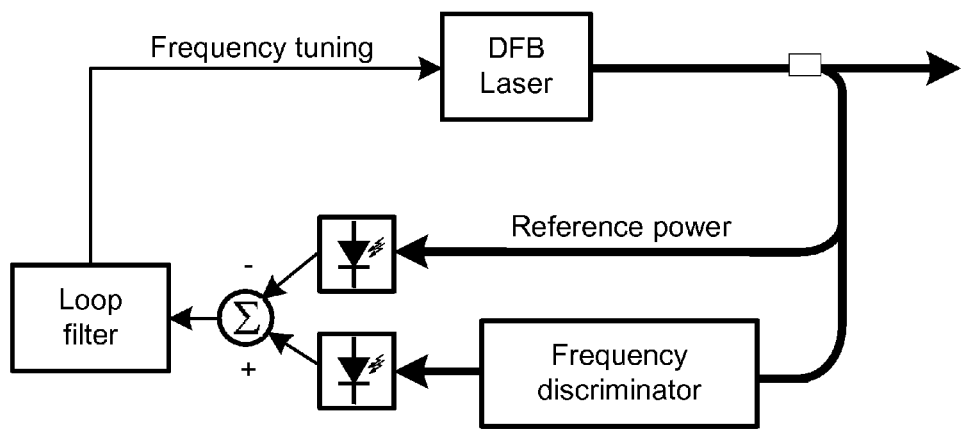
FIG. 2 (PRIOR ART) is a schematized representation of an electrical feedback loop system for noise reduction of a DFB semiconductor laser at low-frequencies.
Figure 3:
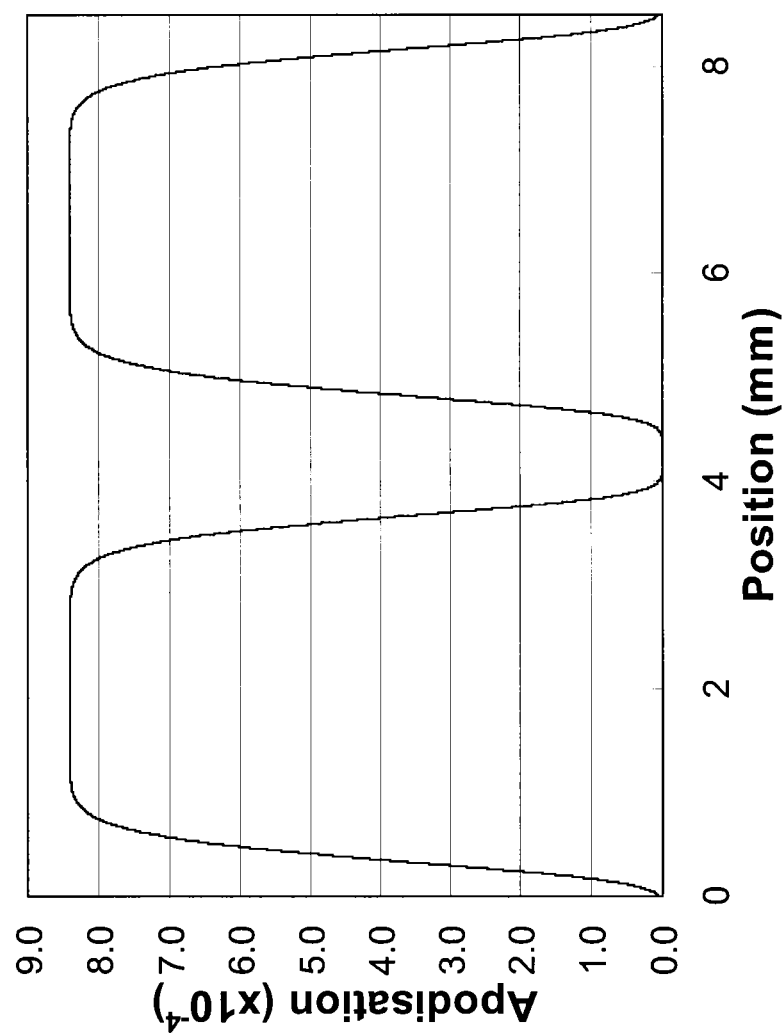
FIG. 3 is a graph showing the apodisation profile of a Fabry-Perot fiber Bragg grating constituted of two highly reflective sections that are π-shifted with regards to one another.
Figure 4A:
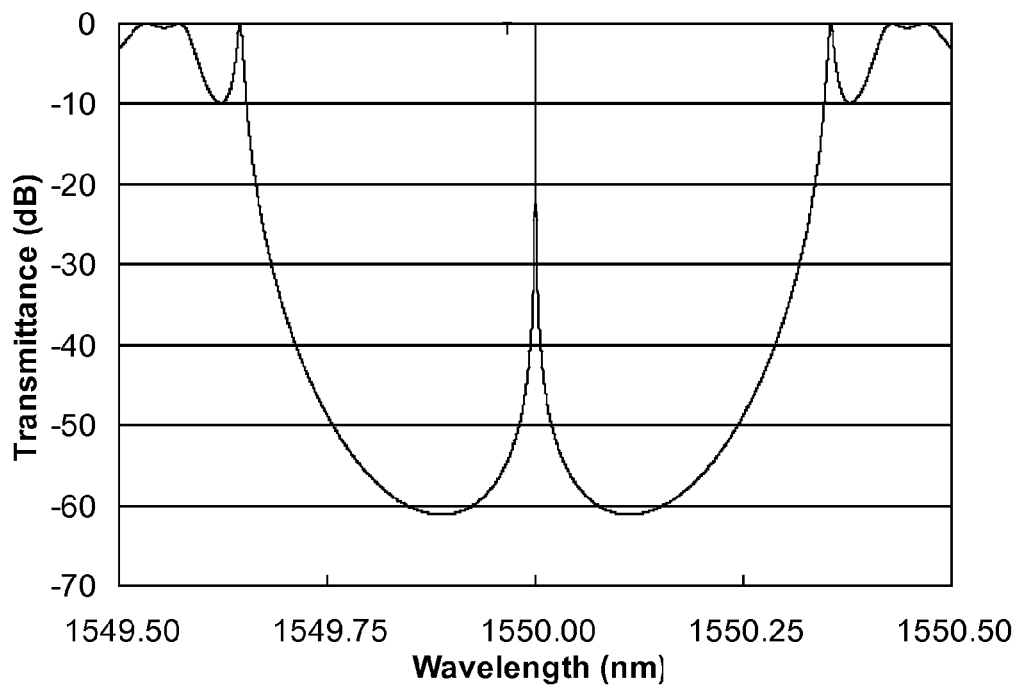
FIG. 4A is a graph showing the optical transmission spectrum of a π-shifted Fabry-Perot FBG such as shown in FIG. 3.
Figure 4B:
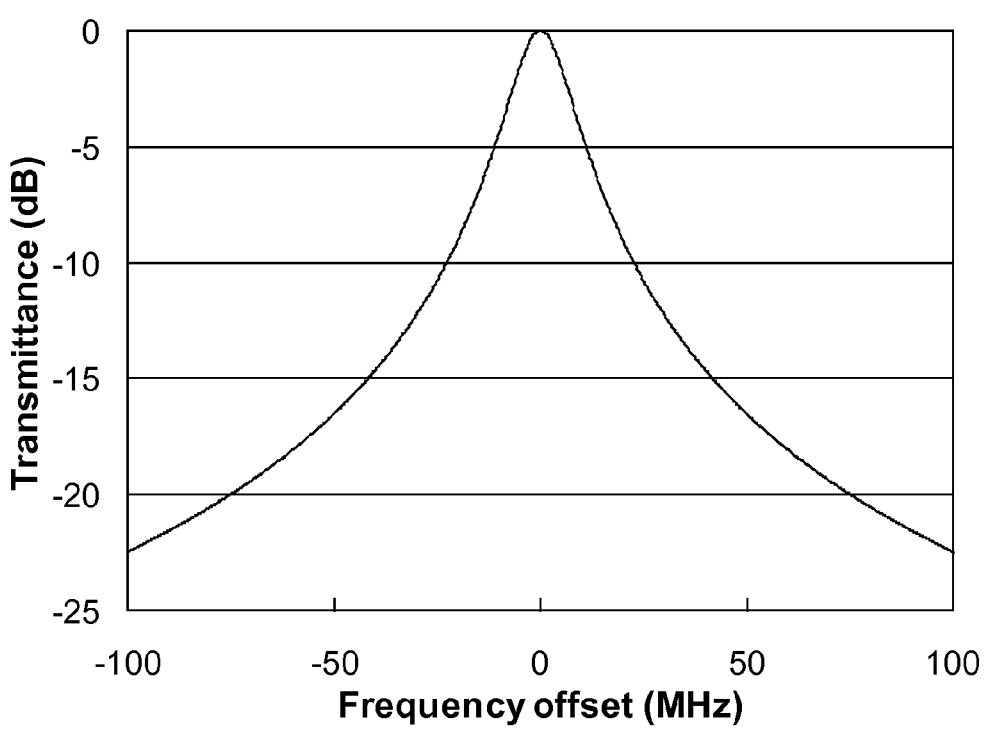
FIG. 4B is an enlargement of a portion of FIG. 4A.
Figure 5:
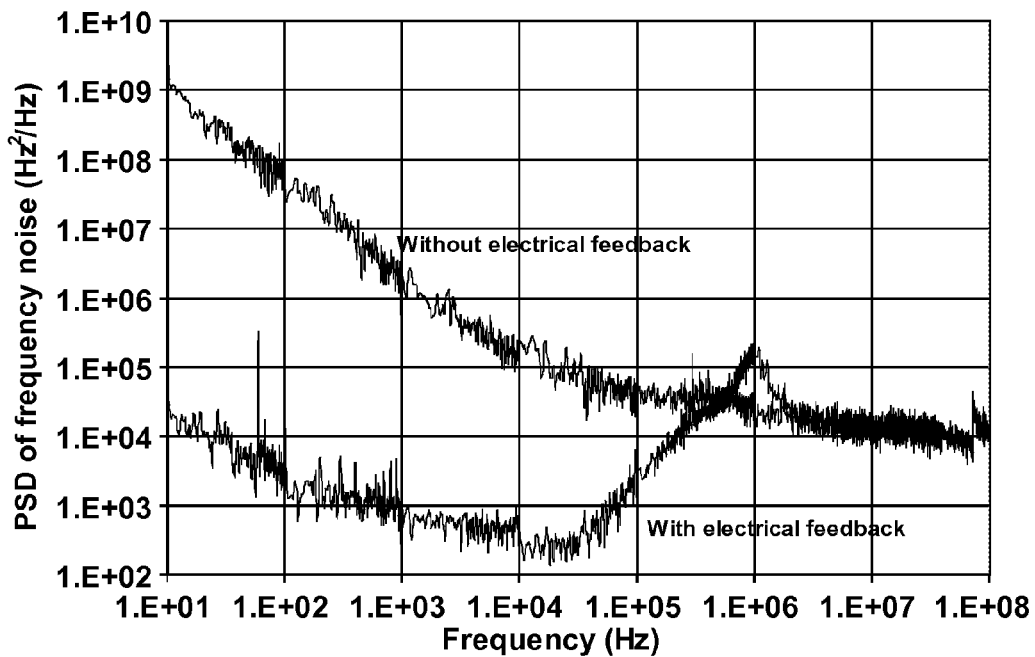
FIG. 5 (PRIOR ART) is a graph showing the PSD of the frequency noise of a semiconductor DFB laser with and without electrical feedback to reduce the noise at low frequencies.
Figure 8A:
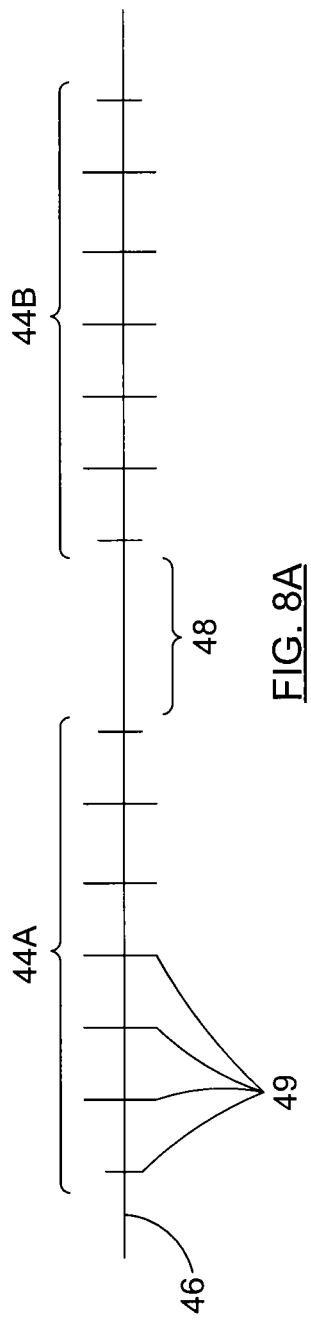
FIG. 8A is a schematic representation of a narrowband optical filter.
Figure 8B:
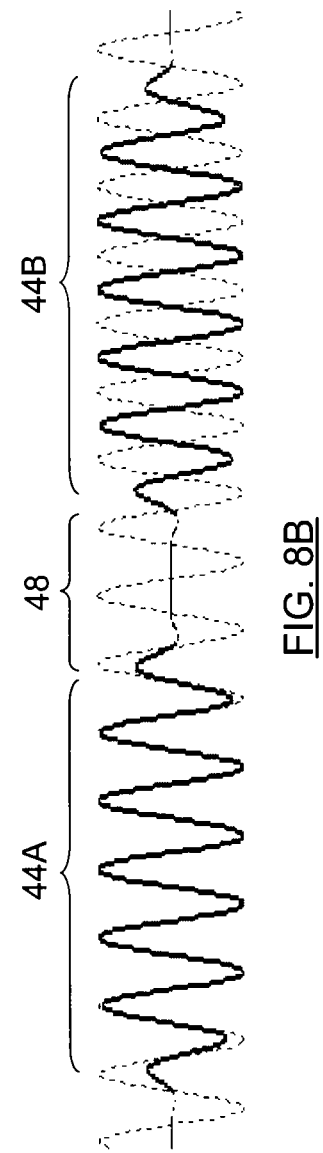
FIG. 8B illustrates the periodic modulation of the index of refraction of the optical filter of FIG. 8A.

As aforementioned, an all-fiber Fabry-Perot interferometer can be made of two fiber Bragg gratings (FBGs) that are π-shifted with regards to one another, such as illustrated in FIG. 3, a limiting form being a single FBG with a π phase shift in the middle. The structure of a FBG-based Fabry-Perot interferometer is further detailed in FIGS. 8A and 8B. A FBG is made of a periodical modulation of the index of refraction along an optical fiber. A Fabry-Perot can be made of first and second grating regions 44A and 44B, preferably identical, provided along a waveguiding axis of an optical medium 46, such as an optical fiber, as shown schematically in FIG. 8A. Each line 49 represents for example a local maximum of the index of refraction. The length of lines 49 is varied to represent variation in the amplitude of the refractive index modulation. This variation is also represented by the apodisation profile given in FIG. 3. The refractive index modulation is further represented in FIG. 8B as a thick line. The variation in the amplitude of the modulation is visible, with no modulation at all being present over region 48. This variation was also represented by the apodisation profile in FIG. 3. It can be seen that the first and second grating regions define together a Bragg grating having a refractive index modulation along the waveguiding axis including a π phase shift at its center. This phase shift is further illustrated with a dotted line representing a continuous modulation of constant amplitude over the whole length of the device that is in phase with the modulation of grating 44A. As shown, a π phase shift takes place between the modulations of gratings 44A and 44B, the index of refraction of grating 44B being minimum where a continuation of the modulation of grating 44A would be maximum and vice versa. As illustrated in FIGS. 4A and 4B, such an interferometer typically reflects light over a spectral range of tens of GHz, except for a narrow band transmission peak within this spectral range. The it phase shift ensures that this peak is located at the center of the spectral range. Such a FBG Fabry-Perot interferometer can thus be used in transmission to filter optical noise around an optical carrier aligned with the transmission peak, filtering up to tens of GHz away from the optical carrier while leaving only a narrow band spectrum through.

Per se, such FBG interferometer produces a single transmission peak. However, as known in the art, adding a periodic modulation to the phase of a fiber Bragg grating, a process known as phase sampling, can generate a multi-channel spectral response, each channel being similar to the spectral response of the grating. The periodic is modulation can be incorporated in a phase mask used to fabricate the fiber Bragg grating. It is thus possible to obtain a multiplicity of narrow transmission peaks by phase sampling of a FBG interferometer. The separation between the peaks is determined by the period of the phase modulation. It is thus possible to obtain, for example, a filter with narrow transmission peaks that are equally distributed over the whole C-band of optical telecommunications (generally considered between 1530 and 1565 nm), the spacing between the peaks, e.g. 50 GHz, 100 GHz or other, being determined by design. Reference can for example be made to U.S. Pat. No. 6,707,967 (ROTHENBERG et al) for information on the design of Bragg gratings through phase sampling, the contents of which are incorporated herein by reference.

Figure 9:
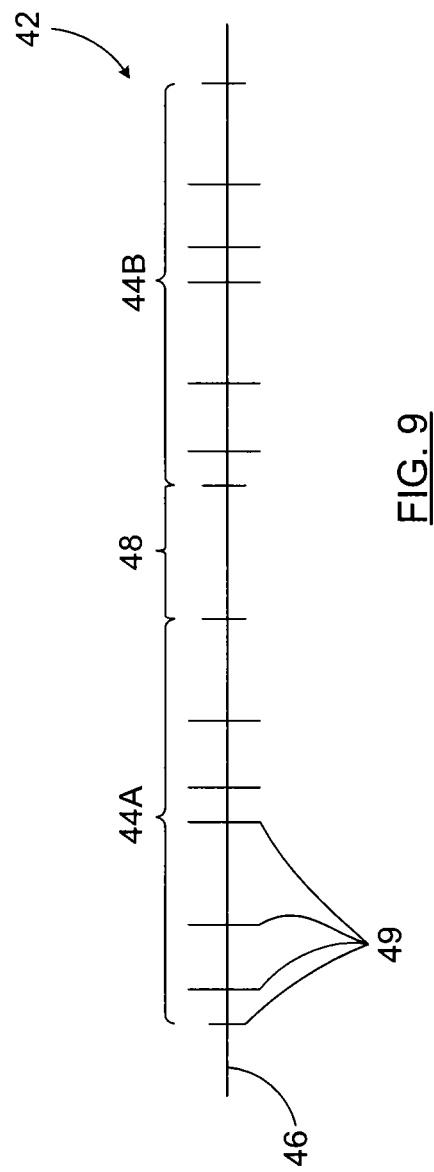
FIG. 9 is a schematic representation of a multi-channel narrowband optical filter according to an embodiment of the invention.

For example, referring to FIG. 9, the optical filter 42 can be based on first and second grating regions 44A and 44B provided along a waveguiding axis of an optical medium 46, such as an optical fiber. A grating-free central region 48 extends between the first and second grating regions 44A and 44B, It can be seen that the first and second grating regions define together a Bragg grating having a modulation of the refractive index along the waveguiding axis. The modulation of the refractive index is identical to the refractive index modulation of the FBG illustrated in FIGS. 8A and 8B, except for an added periodical phase modulation. The periodical phase modulation alters the position of the maxima 49 of the refractive index modulation, as represented schematically in FIG. 9. As aformentioned, this periodical phase modulation produces a multiplicity of reflection channels identical to the reflection channel produced by the FBG without the phase modulation. In the present instance, a multiplicity of reflection channels is produced with a narrow transmission notch in each channel. In this embodiment, each narrow transmission notch defines one of the spectral features used to filter laser beam 24.

Figure 10A:
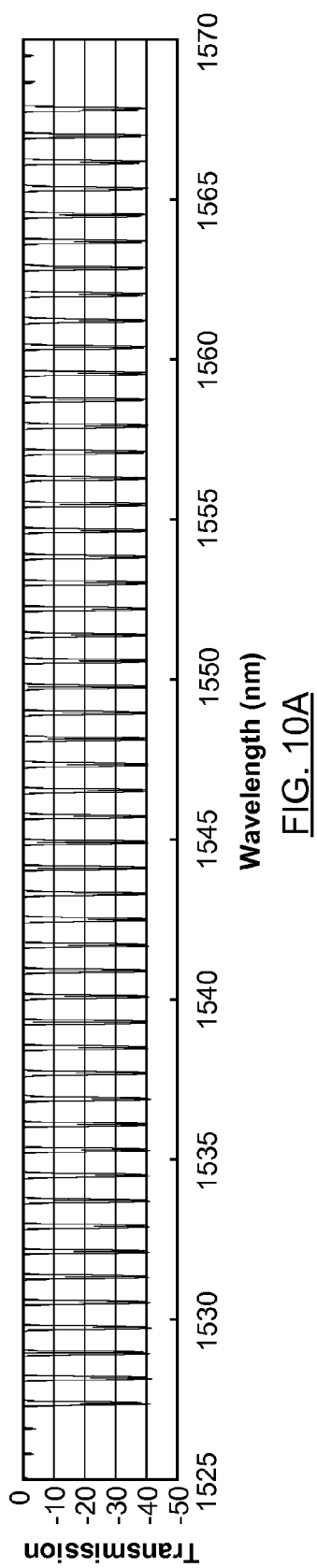
FIG. 10A illustrates the simulated transmission spectrum of a multi-channel π-shifted FBG.
Figure 10B:
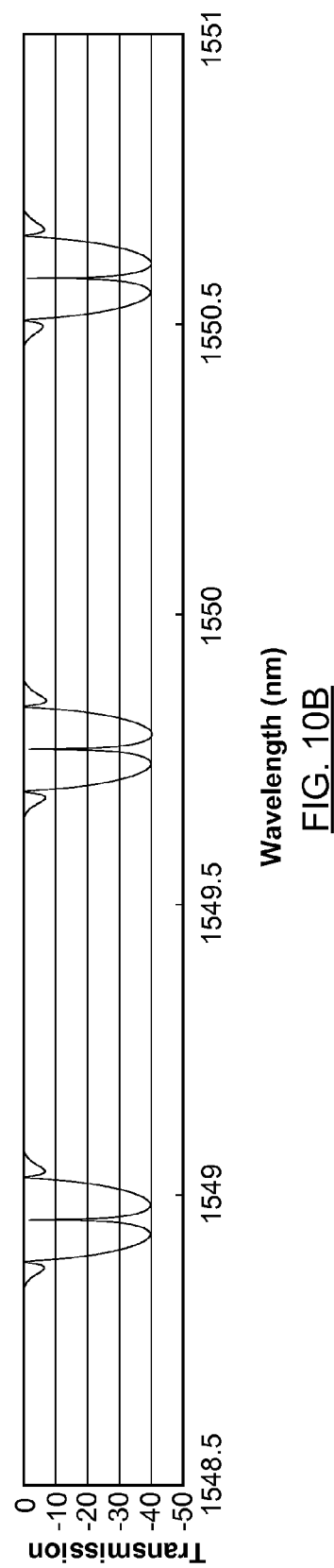
FIG. 10B is a zoom over three channels of FIG. 10A.

As an example, a multichannel FBG providing a 40 MHz (FWHM) transmission notch was designed. A simple Gaussian apodisation profile was chosen for this grating. A 1014-µm periodic phase sampling cell is added to the grating phase to produce 51 narrow resonances spaced by 100 GHz. The broadband response of the filter is shown in FIG. 10A and a zoom over three of the transmission notches is shown in FIG. 10B. The maximum index change for this FBG is $1.5 \times 10^{-3}$.

Figure 11:
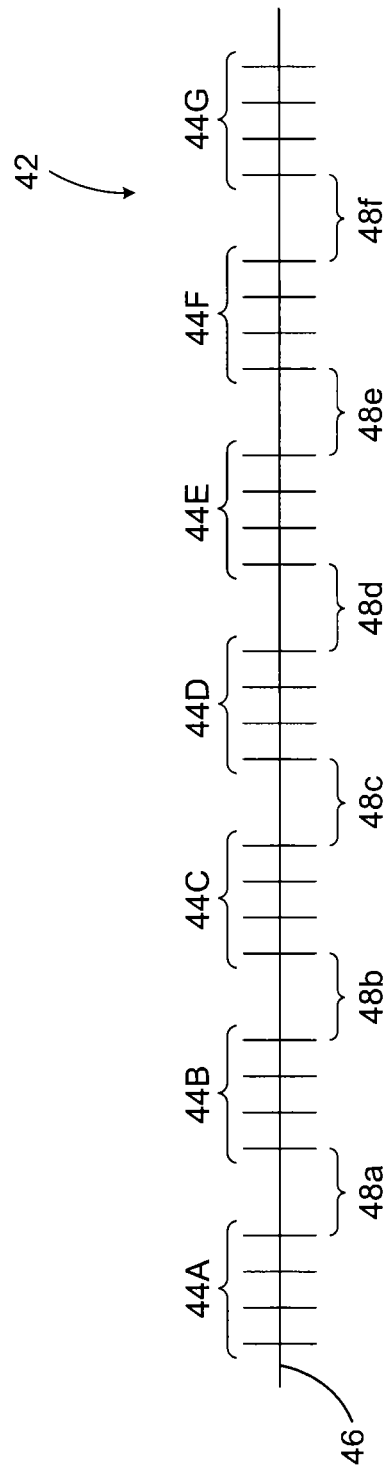
FIG. 11 is a schematic representation of an optical filter providing flat-top narrowband transmission peaks according to another embodiment of the invention.

With reference to FIG. 11, there is shown a variant of the embodiment above designed to provide spectral features having a flat-top shape. In this case, the optical filter 42 includes a plurality of grating regions 44A, 44B, 44C, etc, provided along the waveguiding axis of an optical fiber or other optical medium 46. In this design, there is a corresponding grating-free central region 48a, 48b, 48c, etc, extending between each pair of consecutive grating regions. The grating regions define together a Bragg grating having a modulation of the index of refraction along the waveguiding axis including a π shift between each of the grating regions. The phase profile of the Bragg grating is further preferably sampled. This results in a spectral response for the overall Bragg grating consisting in a multiplicity of reflection channels, each channel including a flat-top narrow transmission notch, the narrow transmission notches defining the spectral features of the filter.

More details on optical filters according to both embodiments above can be found in U.S. patent application Ser. No. 12/984,270, filed on Jan. 4, 2011, the contents of which are incorporated herein by reference in their entirety.

Multiple peaks in transmission can also be obtained using two or mode superimposed chirped fiber Bragg gratings. As known in the art, other filters such as bulk or cleaved fiber Fabry-Perot cavities have periodic optical features and can be considered to achieve optical filtering of white frequency noise.

Referring again back to FIG. 6, the semiconductor laser source 20 further includes a locking mechanism 50 controllable for locking a spectral alignment between the frequency of the laser beam 24 and any selected one of the spectral features of the optical filter 42. This alignment ensures a good transmission or reflection of the laser beam 24 at the desired frequency, whereas optical power away from this frequency, stemming from frequency noise, gets filtered out.

In some embodiments, the locking mechanism 50 may control the laser tuning mechanism 26 to provide and maintain the desired spectral alignment.

Alternatively, a filter tuning mechanism 52 may be coupled to the optical filter 42 for tuning the position of the selected spectral feature, and the locking mechanism 50 could then control this filter tuning mechanism 52 to provide and maintain the spectral alignment. Such embodiments can be advantageous when the laser source, such as an ITLA, is already configured to lock its frequency of emission on a predetermined grid of channels such as the ITU grid of optical telecommunications. Under these conditions, a sufficiently large tuning capability can be used to adapt the channel grid of the optical filter to that of the laser. For example, an optical filter with transmission peaks separated by 100 GHz could still be used to filter laser emission over a grid of 50 GHz.

Other variants may rely on a tuning of both the laser assembly 22 and the optical filter 42.

Various techniques can be used to align the laser output and a spectral feature of the optical filter. They generally involve modulating this alignment, detecting the effect of the modulation on the optical power transmitted or reflected by the filter, and generating a correction signal to compensate for any misalignment. Therefore, the locking mechanism 50 generally includes a frequency modulating assembly for imposing a frequency modulation on the laser beam, which results in the optical filter providing a modulated feedback signal related to the error in the spectral alignment between the frequency of the laser beam with the selected spectral feature of the optical filter. In other embodiments, the locking mechanism 50 may include a filter modulating assembly imposing a modulation on the spectral response of the optical filter 42, which also provides a modulated feedback signal. In either case, a feedback loop is further provided for detecting the feedback signal and comparing this feedback signal with the frequency modulation, which allows assessing the spectral misalignment between the laser and the optical filter. A correction signal for correcting the spectral alignment is generated from this comparison, and can be applied to the laser assembly 22, the optical filter 42 or both.

The frequency modulating assembly may be embodied by any appropriate component or combination of components able to impose a given frequency modulation on the laser beam 24. In one embodiment, this is achieved by shifting periodically the frequency of the laser beam 24 by controlling the laser tuning mechanism 26 to tune the semiconductor assembly 22 accordingly. Modulation of the laser beam 24 can also be realized externally to the laser with a phase modulator (not shown). The phase modulator can be positioned between the semiconductor laser assembly 22 and the optical filter 42 and be controlled by a modulation source.

The filter modulating assembly may be embodied by any means of controlling the spectral response of the optical filter 42. As known in the art, the spectral response of fiber Bragg gratings can be shifted by stretching or by a temperature change. For example, the frequency modulation signal can be applied to a piezoelectric element to which is fixed the fiber Bragg grating filter.

Figure 12:
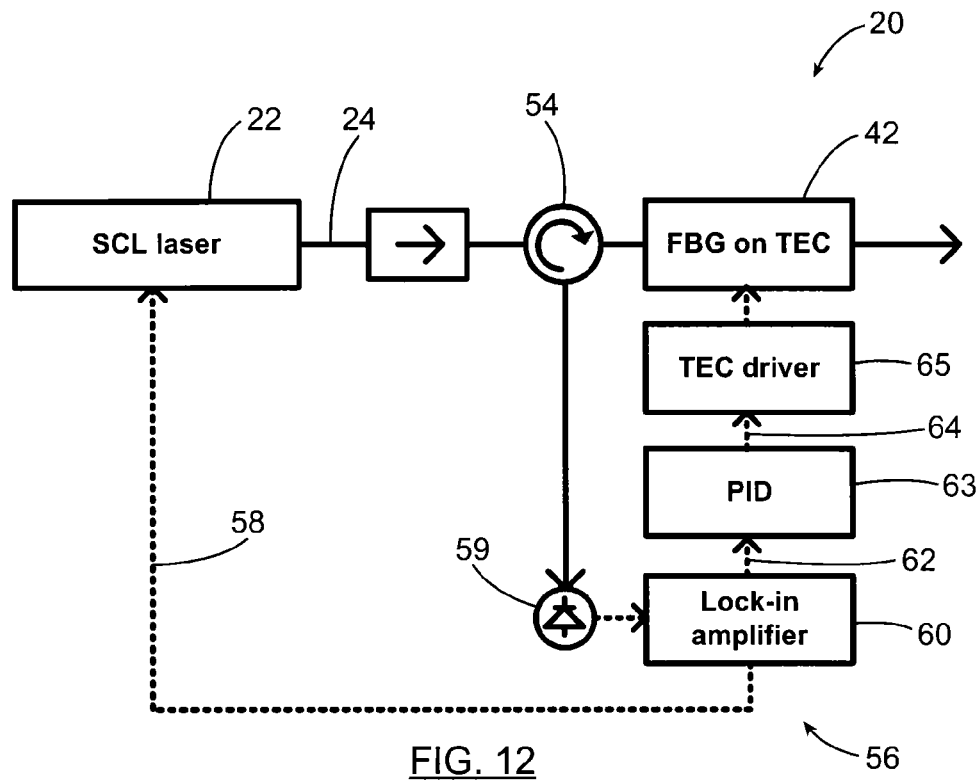
FIG. 12 is a schematized representation of an experimental setup of a semiconductor laser optically filtered by a FBG according to one embodiment of the invention.

FIG. 12 illustrates an example of embodiment of the invention where the optical filter 42 is a fiber Bragg grating and the locking mechanism 50 relies on the well known Pound-Drever-Hall method (R. W. P. Dreyer, J. L. Hall, F. V. Kowalski, et al., "Laser phase and frequency stabilization using an optical resonator", Appl. Phys. B 31(2), 97 (1983)). The laser beam 24 outputted by the semiconductor laser assembly 22 is sent to the optical filter 42 via an optical circulator 54. A periodic signal 58 generated by a lock-in amplifier 60 is used to impart a periodic frequency modulation on the semiconductor laser beam 24, for example by modulating the input current of a DFB laser therein. As aforementioned, such modulation creates sidebands on either sides of the laser beam carrier frequency. The modulated laser beam 24 is incident on the optical filter 42. The portion of the optical power that is aligned with the selected transmission peak of the filter 42 is transmitted by the optical filter 42, whereas the modulation sidebands on either side of the transmission peak of the FBG are reflected and sent back to the circulator 54. Light reflected by optical filter 42 is then detected by a detector 59 and the resulting electrical signal is sent to lock-in amplifier 60. The lock-in amplifier performs the comparison of this electrical signal with the modulation signal 58 and generates an error signal 62. The error signal 62 is sent through a proportional-integral-derivative controller (PID) 63 to generate a correction signal 64. The correction signal 64 is used to control a thermo-electric cooler (TEC) driver 65 and adjust the temperature of a TEC on which is mounted the optical filter 42.

When the Pound-Drever-Hall technique is implemented with a fast enough frequency/phase modulation applied to the laser, the sidebands resulting from this modulation fall outside of the filter window. They are not transmitted by the optical filter and do not appear on the signal output. With this technique, if the feedback signal is applied to the injection current of the laser instead of the filter, the same optical filter can be used to reduce the low-frequency noise and at the same time, filter out the fast fluctuations. In this case, the laser spectrally follows the optical filter and the stability of the optical filter determines the low frequency noise affecting the filtered output.

Figure 13:
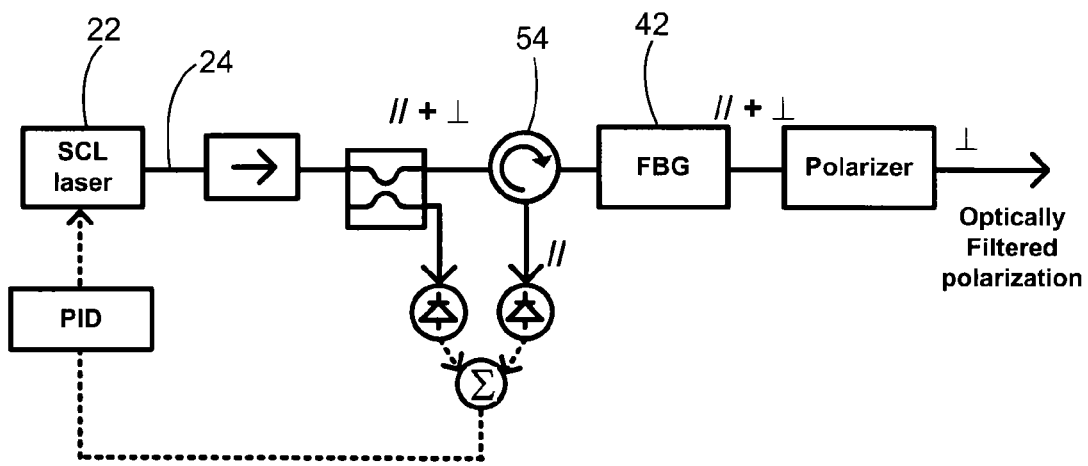
FIG. 13 is a schematized representation of a system using a combination of electrical feedback and optical filtering using the two polarization components of a π phase shifted Bragg grating written in a polarization maintaining fiber.
Figure 14A:
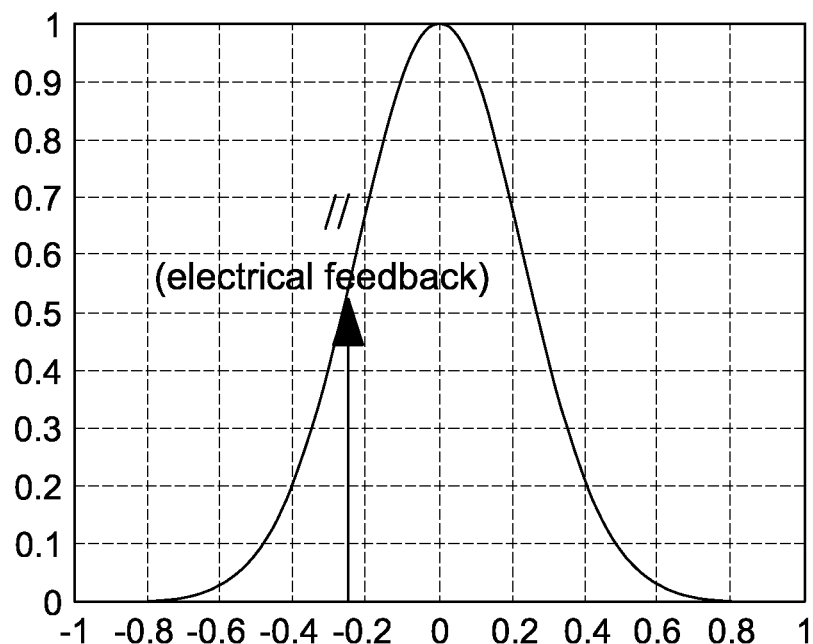
FIGS. 14A and 14B are graphs illustrating the use of a dual polarization FBG for electrical feedback and optical filtering according to an embodiment of the invention, respectively illustrating the alignment of the parallel and the orthogonal polarization components with a spectral feature of the optical filter.
Figure 14B:
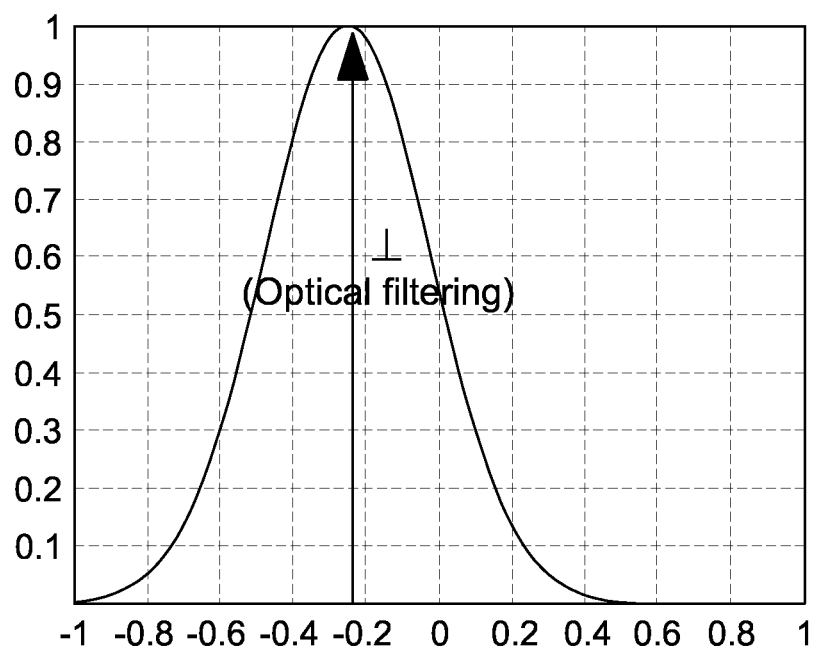

Referring to FIG. 13, there is shown another embodiment of the invention where electrical feedback, which reduces the low-frequency noise of the laser, is combined to the optical filtering to reduce the high-frequency noise. In this embodiment, the optical filter 42 is a polarization-sensitive filter having a first spectral response for light in a first polarization state and a second spectral response for light in a second polarization state orthogonal to the first polarization state. Each of the first and second spectral responses includes the same spectral features, but corresponding spectral features in the first and second responses are partially detuned. A grating written in a polarization-maintaining (PM) fiber forming a π-phase shifted Bragg grating can be designed to provide the respective first and second spectral responses. The detuning between the spectral responses of the grating for light in different polarization states arises from the PM fiber being birefringent, i.e. having different index of refraction for each polarization. The ideal FBG is designed to provide a first spectral response for a first polarization with a maximum transmission that falls on the side of the transmission peak of the second optical response for a second polarization orthogonal to said first polarization, as illustrated in FIGS. 14A and 14B. The detuning between the two spectral responses is thus about half the full width at half maximum of the transmission peak. The polarization of light beam 24 is adjusted to have first and second polarization components in the first and second polarization states. One of these components can be used to sense the side of a transmission peak of the grating as shown in FIG. 14A, the grating therefore acting as a frequency discriminator, and perform electrical feedback on the laser injection current to reduce low frequency noise. At the same time, the other polarization component is optically filtered by the grating, as shown in FIG. 14B, and used by the locking mechanism for locking the spectral alignment between the laser assembly 22 and the optical filter 42. To optimize the optical output power, the laser light is launched into the FBG fiber in such a way that a small portion of the optical power is aligned with one polarization for electrical feedback while the remaining light is is aligned with the other polarization for optical filtering. Since both spectral responses emanate from the same grating, they will undergo the same variations under environmental perturbations and will thus maintain their relative detuning. As long as light in the first state of polarization is locked to the side of a transmission peak of said first spectral response, light in the other polarization will be automatically centered on the transmission peak of the second spectral response. In this case, no modulation is needed and the electrical circuit can be simplified.

Figure 15:
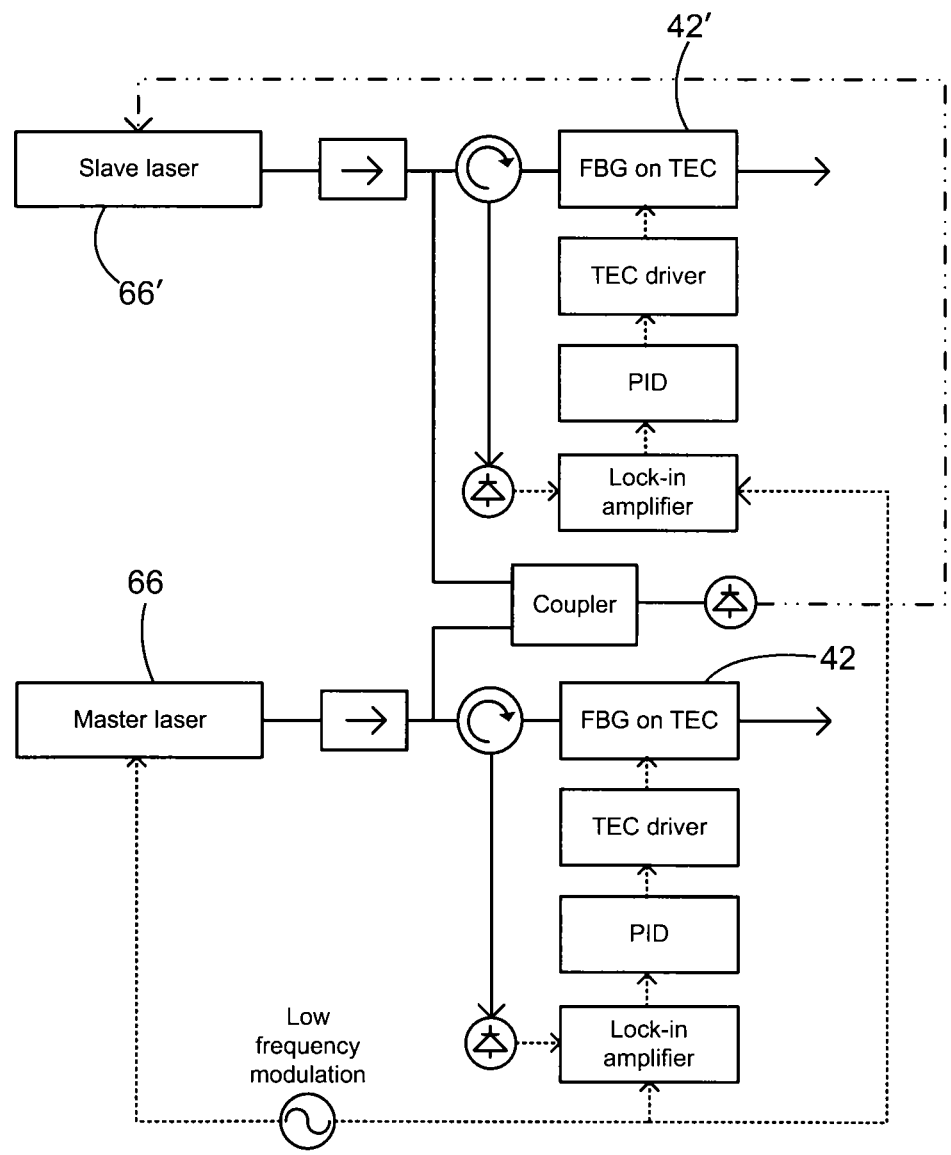
FIG. 15 is a schematized representation of an experimental setup of a master and slave lasers locking system, each laser being optically filtered by its own FBG filter.

FIG. 15 presents another embodiment of the invention where a master laser 66 and a slave laser 66' are both filtered each by an optical filter 42 and 42'. The slave laser 66' is further phase-locked to the master laser 66 by a feedback loop as known in the art, this phase-locking ensuring that both lasers maintain a constant phase difference. This technique will be recognized by those skilled in the art to be also applicable to the case of offset-frequency locking of two lasers, where the lasers are made to maintain a constant frequency difference in their optical frequencies of emission. In one embodiment, the frequency modulation can be applied only to the master laser 66, as discussed above. When the modulation frequency is small, i.e. within the bandwidth of the phase-locking loop, the resulting modulation in the frequency of emission of the master laser will be transferred to the slave laser by virtue of their phase-locking, thus providing a frequency modulation for the slave laser that is coherent with that applied to the master laser. As a result, each laser can be locked spectrally to its dedicated optical filter 42 or 42', thus producing an output with reduced high frequency noise. Moreover, the frequency modulations used for spectral alignment will cancel when the lasers beat together. A beat signal with high spectral purity can thus be produced, the phase-locking ensuring a low noise at low frequencies and optical filtering ensuring a low noise at high frequencies. An alternative configuration where the modulation frequency does not lie within the bandwidth of the phase locking loop is also possible. If a larger modulation frequency is to be used, the two lasers should be modulated independently to lock them to their respective optical filter. In the schemes where a modulation frequency larger than the bandwidth of the locking loop is used, the modulation frequencies need not be the same. However, there may be an advantage in using the same modulating signal frequency as the modulation signal can be managed not to appear on the resulting beat note signal. This can be accomplished by properly adjusting the relative phase of each modulation signal sent to the lasers.

In a further integration step, the optical filter and necessary components could be packaged together with a tunable laser. Furthermore, the optical filter and optical components could be integrated in a photonic chip based on the silicon-on-insulator (SOI) technology, for example, to which a tunable laser would be directly coupled. The phase-sampled optical filter could then be fabricated directly on the photonic chip. The tunable laser and its optical filter could then be integrated within the same package. InP technology could be used, allowing the tunable laser and the optical filter to be built on the same photonic integrated circuit (PIC).

According to another aspect of the present invention, there is provided a method for providing a low white frequency noise laser beam at a tunable frequency, for example using a semiconductor laser source as described above or a similar system.

The method first includes generating the laser beam, using a single-mode semiconductor laser, at the desired frequency. As will be readily understood by one skilled in the art, tunable semiconductor laser assemblies are available and give a user the control over the optical frequency of the generated light, so that it can be to tunable over a spectral range of interest, for example the C-band.

The method further involves filtering the laser beam with an optical filter having multiple spectral features distributed over the entire spectral range of interest, each spectral feature having a narrow spectral range. The optical power at the desired frequency is transmitted by the filter while sidebands resulting from noise are reflected, or vice versa.

The last step of the method is to lock the spectral alignment between the frequency of the laser beam and a selected one of the spectral features of the optical filter. This may be accomplished by either tuning the frequency of emission of the semiconductor laser, tuning the position of the selected spectral feature, or both. Various schemes can be used to perform this locking, as explained above and as will be readily understood by one skilled in the art.

Of course, numerous modifications could be made to the embodiments described above without departing from the scope of the present invention.

The invention claimed is:

1. A low white frequency noise tunable semiconductor laser source, comprising:
a semiconductor laser assembly comprising at least one single-mode semiconductor laser generating a laser beam having a frequency and a laser tuning mechanism coupled to the at least one single-mode semiconductor laser for tuning the frequency of the laser beam generated thereby over a spectral range of interest, wherein the at least one single-mode semiconductor laser comprises an array of semiconductor laser units, each of said semiconductor laser units having an output frequency within a corresponding limited spectral range such that the limited spectral range of all of said units collectively cover the spectral range of interest, the laser tuning mechanism comprising a selector for selecting an output of one of said units as the laser beam;
an optical filter in a path of the laser beam and having multiple spectral features distributed over the entire spectral range of interest, each spectral feature having a narrow spectral range; and
a locking mechanism controllable for locking a spectral alignment between the frequency of the laser beam and any selected one of the spectral features of the optical filter.

2. The low white frequency noise tunable semiconductor laser source according to claim 1, wherein the laser tuning mechanism further comprises a unit controller for controlling the output frequency of each of said semiconductor laser units over the corresponding limited spectral range.

3. A low white frequency noise tunable semiconductor laser source, comprising:
a semiconductor laser assembly comprising at least one single-mode semiconductor laser generating a laser beam having a frequency and a laser tuning mechanism coupled to the at least one single-mode semiconductor laser for tuning the frequency of the laser beam generated thereby over a spectral range of interest;
an optical filter in a path of the laser beam and having multiple spectral features distributed over the entire spectral range of interest, each spectral feature being a transmission peak and having a narrow spectral range, wherein the optical filter comprises a Bragg grating having a sampled phase profile including a π shift at a center thereof, said Bragg grating having a spectral response including a plurality of reflection channels and a narrow transmission notch in each of said reflection channels, each of said narrow transmission notches defining one of said spectral features; and a locking mechanism controllable for locking a spectral alignment between the frequency of the laser beam and any selected one of the spectral features of the optical filter.

4. The low white frequency noise tunable semiconductor laser source according to claim 3, wherein the at least one single-mode semiconductor laser comprises a distributed feedback laser having a cavity structure defined by a diffraction grating, and the laser tuning mechanism comprises a temperature changing assembly for imposing a temperature change on at least a portion of said diffraction grating.

5. The low white frequency noise tunable semiconductor laser source according to claim 3, wherein the at least one single-mode semiconductor laser comprises a distributed Bragg reflector laser having a cavity structure defined by a pair of Bragg reflectors, and the laser tuning mechanism comprises a controller for controlling said Bragg reflectors.

6. The low white frequency noise tunable semiconductor laser source according to claim 3, wherein the spectral range of interest is the C-band.

7. The low white frequency noise tunable semiconductor laser source according to claim 3, wherein said Bragg grating is defined by first and second grating regions provided along a waveguiding axis of an optical medium and a grating-free central region extending between the first and second grating regions.

8. The low white frequency noise tunable semiconductor laser source according to claim 3, wherein the spectral features are distributed periodically over the spectral range of interest.

9. The low white frequency noise tunable semiconductor laser source according to claim 3, wherein the locking mechanism controls the laser tuning mechanism to provide and maintain said spectral alignment.

10. The low white frequency noise tunable semiconductor laser source according to claim 3, wherein the at least one single-mode semiconductor laser comprises an array of semiconductor laser units, each of said semiconductor laser units having an output frequency within a corresponding limited spectral range such that the limited spectral range of all of said units collectively cover the spectral range of interest, the laser tuning mechanism comprising a selector for selecting an output of one of said units as the laser beam.

11. The low white frequency noise tunable semiconductor laser source according to claim 3, further comprising a filter tuning mechanism coupled to the optical filter for tuning a position of the selected spectral feature.

12. The low white frequency noise tunable semiconductor laser source according to claim 3, wherein the locking mechanism controls the filter tuning mechanism to provide and maintain said spectral alignment.

13. The low white frequency noise tunable semiconductor laser source according to claim 3, wherein the locking mechanism comprises:

a modulating assembly for imposing a modulation on the spectral alignment between the frequency of the laser beam with the selected spectral feature of the optical filter, the optical filter thereby providing a modulated feedback signal related to an error in said spectral alignment; and a feed back loop for detecting the feedback signal, comparing the same with said modulation and generating from said comparing a correction signal for correcting said spectral alignment.

14. The low white frequency noise tunable semiconductor laser source according to claim 3, wherein the optical filter is a polarization-sensitive filter having a first spectral response for light in a first polarization state and a second spectral response for light in a second polarization state orthogonal to the first polarization state, each of said first and second spectral responses comprises said spectral features, corresponding spectral features in said first and second responses being partially detuned, the laser beam having first and second polarization components in said first and second polarization states, respectively, the locking mechanism using one of said first and second components for locking said spectral alignment.

15. A low white frequency noise tunable semiconductor laser source, comprising:

a semiconductor laser assembly comprising at least one single-mode semiconductor laser generating a laser beam having a frequency and a laser tuning mechanism coupled to the at least one single-mode semiconductor laser for tuning the frequency of the laser beam generated thereby over a spectral range of interest;

an optical filter in a path of the laser beam and having multiple spectral features distributed over the entire spectral range of interest, each spectral feature being a transmission peak and having a narrow spectral range, wherein the optical filter comprises a plurality of grating regions provided along a waveguiding axis of an optical medium, consecutive ones of said plurality of grating regions being separated by a corresponding grating-free central region extending therebetween, the plurality of grating regions defining together a Bragg grating having a sampled phase profile including a $\pi$ phase shift between each of said plurality of grating regions, said Bragg grating having a spectral response including a plurality of reflection channels and a flat-top narrow transmission notch in each of said reflection channels, each of said flat-top narrow transmission notches defining one of said spectral features; and a locking mechanism controllable for locking a spectral alignment between the frequency of the laser beam and any selected one of the spectral features of the optical filter.

16. A low white frequency noise tunable semiconductor laser source, comprising:

a semiconductor laser assembly comprising at least one single-mode semiconductor laser generating a laser beam having a frequency and a laser tuning mechanism coupled to the at least one single-mode semiconductor laser for tuning the frequency of the laser beam generated thereby over a spectral range of interest;

an optical filter in a path of the laser beam and having multiple spectral features distributed over the entire spectral range of interest, each spectral feature having a narrow spectral range, wherein the optical filter comprises an all-fiber or bulk Fabry-Perot interferometer; and a locking mechanism controllable for locking a spectral alignment between the frequency of the laser beam and any selected one of the spectral features of the optical filter.

17. A white frequency noise tunable semiconductor laser source, comprising:

a semiconductor laser assembly comprising at least one single-mode semiconductor laser generating a laser beam having a frequency and a laser tuning mechanism coupled to the at least one single-mode semiconductor laser for tuning the frequency of the laser beam generated thereby over a spectral range of interest;

an optical filter in a path of the laser beam and having multiple spectral features distributed over the entire spectral range of interest, each spectral feature having a narrow spectral range;

a locking mechanism controllable for locking a spectral alignment between the frequency of the laser beam and any selected one of the spectral features of the optical filter; and a filter tuning mechanism coupled to the optical filter for tuning a position of the selected spectral feature.

18. The low white frequency noise tunable semiconductor laser source according to claim 17, wherein the locking mechanism controls the filter tuning mechanism to provide and maintain said spectral alignment.

19. The low white frequency noise tunable semiconductor laser source according to claim 17, wherein the at least one single-mode semiconductor laser comprises an array of semiconductor laser units, each of said semiconductor laser units having an output frequency within a corresponding limited spectral range such that the limited spectral range of all of said units collectively cover the spectral range of interest, the laser tuning mechanism comprising a selector for selecting an output of one of said units as the laser beam.

20. The low white frequency noise tunable semiconductor laser source according to claim 17, wherein each spectral feature of the optical filter is a reflection peak.

21. The low white frequency noise tunable semiconductor laser source according to claim 17, wherein each spectral feature of the optical filter is a transmission peak.

22. The low white frequency noise tunable semiconductor laser source according to claim 17, wherein the optical filter comprises a plurality of grating regions provided along a waveguiding axis of an optical medium, consecutive ones of said plurality of grating regions being separated by a corresponding grating-free central region extending therebetween, the plurality of grating regions defining together a Bragg grating having a sampled phase profile including a π phase shift between each of said plurality of grating regions, said Bragg grating having a spectral response including a plurality of reflection channels and a flat-top narrow transmission notch in each of said reflection channels, each of said narrow transmission notches defining one of said spectral features.

23. The low white frequency noise tunable semiconductor laser source according to claim 17, wherein the optical filter comprises an all-fiber or bulk Fabry-Perot interferometer.

24. The low white frequency noise tunable semiconductor laser source according to claim 17, wherein the spectral features are distributed periodically over the spectral range of interest.

25. The low white frequency noise tunable semiconductor laser source according to claim 17, wherein the locking mechanism controls the laser tuning mechanism to provide and maintain said spectral alignment.

26. The low white frequency noise tunable semiconductor laser source according to claim 17, wherein the locking mechanism comprises:

a modulating assembly for imposing a modulation on the spectral alignment between the frequency of the laser beam with the selected spectral feature of the optical filter, the optical filter thereby providing a modulated feedback signal related to an error in said spectral alignment; and a feed back loop for detecting the feedback signal, comparing the same with said modulation and generating from said comparing a correction signal for correcting said spectral alignment.

27. The low white frequency noise tunable semiconductor laser source according to claim 17, wherein the optical filter is a polarization-sensitive filter having a first spectral response for light in a first polarization state and a second spectral response for light in a second polarization state orthogonal to the first polarization state, each of said first and second spectral responses comprises said spectral features, corresponding spectral features in said first and second responses being partially detuned, the laser beam having first and second polarization components in said first and second polarization states, respectively, the locking mechanism using one of said first and second components for locking said spectral alignment.

28. A low white frequency noise tunable semiconductor laser source, comprising:

a semiconductor laser assembly comprising at least one single-mode semiconductor laser generating a laser beam having a frequency and a laser tuning mechanism coupled to the at least one single-mode semiconductor laser for tuning the frequency of the laser beam generated thereby over a spectral range of interest;

an optical filter in a path of the laser beam and having multiple spectral features distributed over the entire spectral range of interest, each spectral feature having a narrow spectral range; and a locking mechanism controllable for locking a spectral alignment between the frequency of the laser beam and any selected one of the spectral features of the optical filter, the locking mechanism comprising:

a modulating assembly for imposing a modulation on the spectral alignment between the frequency of the laser beam with the selected spectral feature of the optical filter, the optical filter thereby providing a modulated feedback signal related to an error in said spectral alignment; and a feed back loop for detecting the feedback signal, comparing the same with said modulation and generating from said comparing a correction signal for correcting said spectral alignment.

29. The low white frequency noise tunable semiconductor laser source according to claim 28, wherein the modulation assembly imposes said modulation on the frequency of the laser beam.

30. The low white frequency noise tunable semiconductor laser source according to claim 28, wherein the modulation assembly imposes said modulation on the spectral features of the optical filter.

31. The low white frequency noise tunable semiconductor laser source according to claim 28, wherein the feedback loop provides the correction signal to the laser tuning mechanism to modify the frequency of the laser beam.

32. The low white frequency noise tunable semiconductor laser source according to claim 28, further comprising a filter tuning mechanism coupled to the optical filter for tuning a position of the selected spectral feature, and wherein the feedback loop provides the correction signal to the filter tuning mechanism to modify the position of the selected spectral feature.

33. A low white frequency noise tunable semiconductor laser source, comprising:

a semiconductor laser assembly comprising at least one single-mode semiconductor laser generating a laser beam having a frequency and a laser tuning mechanism coupled to the at least one single-mode semiconductor laser for tuning the frequency of the laser beam generated thereby over a spectral range of interest;

an optical filter in a path of the laser beam and having multiple spectral features distributed over the entire spectral range of interest, each spectral feature having a narrow spectral range, wherein the optical filter is a polarization-sensitive filter having a first spectral response for light in a first polarization state and a second spectral response for light in a second polarization state orthogonal to the first polarization state, each of said first and second spectral responses comprises said spectral features, corresponding spectral features in said first and second responses being partially detuned, the laser beam having first and second polarization components in said first and second polarization states, respectively; and a locking mechanism controllable for locking a spectral alignment between the frequency of the laser beam and any selected one of the spectral features of the optical filter, the locking mechanism using one of said first and second components for locking said spectral alignment.

34. The low white frequency noise tunable semiconductor laser source according to claim 33, wherein another one of said first and second components is used to provide electrical feedback to said semiconductor laser assembly.

35. The low white frequency noise tunable semiconductor laser source according to claim 33, wherein the polarization-sensitive filter is a Bragg grating provided along a polarization-maintaining optical fiber.

* * * * *